(12) United States Patent
Umezawa et al.

(10) Patent No.: US 6,195,307 B1
(45) Date of Patent: Feb. 27, 2001

(54) BOOSTER CIRCUIT AND SEMICONDUCTOR MEMORY DEVICE HAVING THE SAME

(75) Inventors: Akira Umezawa; Shigeru Atsumi, both of Yokohama; Hironori Banba, Kamakura, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/502,045

(22) Filed: Feb. 11, 2000

Related U.S. Application Data (62) Division of application No. 09/028,221, filed on Feb. 23, 1998, now Pat. No. 6,041,011.

(30) Foreign Application Priority Data

Feb. 26, 1997 (JP) .................................................. 9-042244

(51) Int. Cl.[7] .................................................... G11C 7/00
(52) U.S. Cl. .................... 365/226; 365/189.11; 327/536; 327/537
(58) Field of Search ............................... 365/226, 189.11; 327/536, 537

(56) References Cited

U.S. PATENT DOCUMENTS

| | | | |
|---|---|---|---|
| 4,837,466 | 6/1989 | Kanauchi | 307/605 |
| 5,499,209 | 3/1996 | Oowaki et al. | 365/189.11 |
| 5,589,793 | 12/1996 | Kassapian | 327/536 |
| 5,642,072 | 6/1997 | Miyamoto et al. | 327/535 |
| 5,644,534 | 7/1997 | Soejima | 365/185.23 |
| 5,650,741 | 7/1997 | Nakamura et al. | 327/327 |
| 5,812,018 | 9/1998 | Sudo et al. | 327/537 |
| 5,815,446 | 9/1998 | Tobita | 365/189.09 |
| 5,841,703 | 11/1998 | Wojciechowski | 365/189.09 |

*Primary Examiner*—Richard Elms
*Assistant Examiner*—Van Thu Nguyen
(74) *Attorney, Agent, or Firm*—Banner & Witcoff, Ltd.

(57) ABSTRACT

In a booster circuit, a gate of an input-side transistor whose end is supplied with a power supply voltage is supplied with an inverted signal of a signal supplied to a signal input terminal of a booster unit at a first stage or supplied with an AND signal of the inverted signal and a booster circuit activation signal. Therefore, when the transistor at the first stage operates, the input-side transistor is turned off. Accordingly, a back flow of a current from inside the booster circuit to a power supply is prevented, so that the efficiency of the booster circuit can be improved. Further, fluctuations of the output voltage are not brought about even when the power supply voltage greatly fluctuates, so that the reliability of peripheral elements and memory cells can be improved and the allowable range of an external power supply voltage can be widened.

17 Claims, 6 Drawing Sheets

$\Delta Vf = Vf1 - Vf2, \quad Vref = Vf1 + 10 \Delta Vf$

| | φ | /φ | Vgl | OSCE |
|---|---|---|---|---|
| CPD="H" | UNCHANGED | UNCHANGED | L | L |
| CPD="L" | CHANGED<br>UNCHANGED | CHANGED<br>UNCHANGED | CHANGED<br>L | H(Vg<Vref)<br>L(Vg>Vref) |

BOOSTER CIRCUIT AND SEMICONDUCTOR MEMORY DEVICE HAVING THE SAME

This application is a Divisional of U.S. application Ser. No. 09/028,221 filed on Feb. 23, 1998 now U.S. Pat. No. 6,041,011.

BACKGROUND OF THE INVENTION

The present invention relates to a booster circuit and a semiconductor memory device having the same, and more particularly to a booster circuit used in a non-volatile semiconductor memory device such as an EEPROM.

Figure 1:
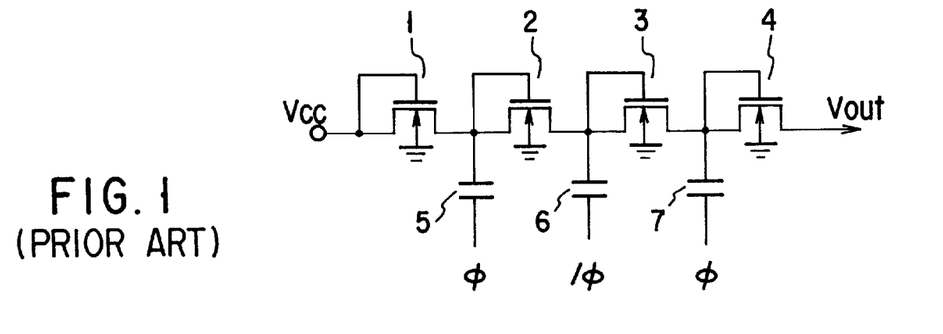
FIG. 1 is a diagram showing an example of a conventional booster circuit.
Figure 2:
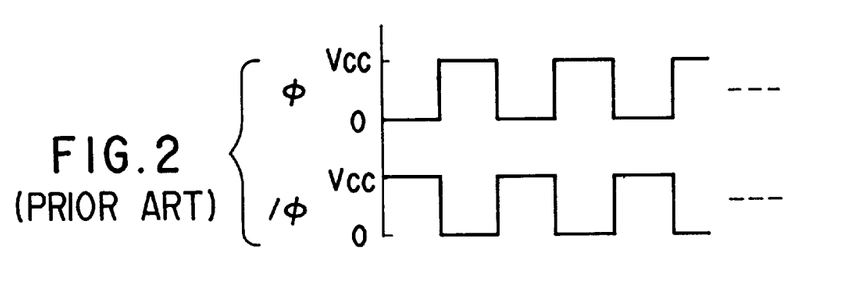
FIG. 2 is a view showing waveforms of clock pulse signals.

FIG. 1 shows an example of a conventional booster circuit. FIG. 2 shows waveforms of clock pulse signals φ and /φ (the mark of "/" means that the signal is inverted).

The booster circuit shown in FIG. 1 includes, for example, four n-channel MOS transistors 1 to 4 and three capacitors 5 to 7. An end of a current path of the transistor 1 and a gate thereof are supplied with a power supply voltage Vcc. The other end of the current path of the transistor 1 is connected to an end of a current path of the transistor 2 and a gate thereof, as well as an end of a capacitor 5. The other end of the capacitor 5 is supplied with a signal φ. The other end of the current path of the transistor 2 is connected with an end of a current path of the transistor 3 and a gate thereof, as well as an end of the capacitor 6. The other end of the capacitor 6 is supplied with a signal /φ. The other end of the current path of the transistor 3 is connected with an end of a current path of the transistor 4 and a gate thereof, as well as an end of the capacitor 7. The other end of the capacitor 7 is supplied with a signal φ. The other end of the current path of the transistor 4 outputs a boosted voltage Vout.

The clock pulse signal φ and the inverted signal /φ thereof oscillate, for example, between the power supply voltage Vcc and 0V as a ground potential as shown in FIG. 2. The clock signals φ and /φ have a frequency expressed as f.

Each of the n-channel MOS transistors 1 to 4 has a threshold value expressed as Vt. The capacitors 5, 6, and 7 have an equal capacity C. Further, the number of stages of the booster circuit is expressed as N and indicates the number of the capacitors of the booster circuit. In the booster circuit shown in FIG. 1, N is 3.

Figure 3:
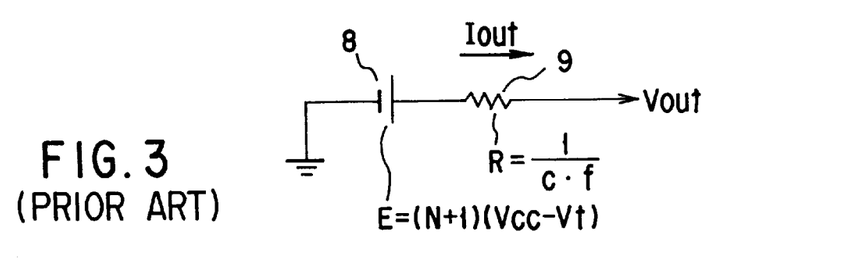
FIG. 3 is a diagram showing an equivalent circuit of the circuit shown in FIG. 1.

FIG. 3 shows a circuit equivalent to the booster circuit shown in FIG. 1. The negative electrode of the voltage source 8 is grounded, and the positive electrode of the voltage source 8 is connected to an end of a resistor 9. The other end of the resistor 9 outputs a voltage Vout. The current flowing through the resistor 9 is expressed as Iout. An output voltage E of the voltage source 8 is obtained by (N+1)× (Vcc−Vt). A resistance value R of the resistor 9 is obtained by 1/(c×f).

Figure 4:
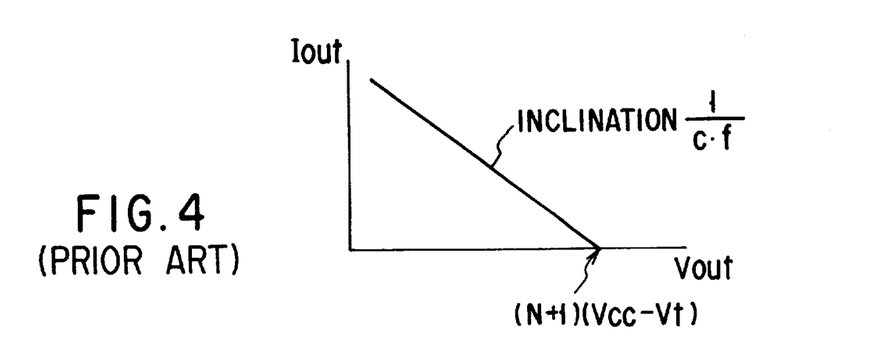
FIG. 4 is a graph showing a load characteristic of the circuit shown in FIG. 1.

FIG. 4 shows a relationship between the output voltage Vout and the output current Iout.

In order to increase the output current Iout without changing the frequency f and the capacity C of each capacitor, the pentode threshold value Vt of the MOS transistors 1 to 4 needs to be 0. For example, the threshold value Vt can be substantially set to 0 by using an intrinsic n-channel MOS transistor, such as an n-channel MOS transistor which is formed on a p-type substrate and has a channel region not implanted with channel ions.

Figure 5:
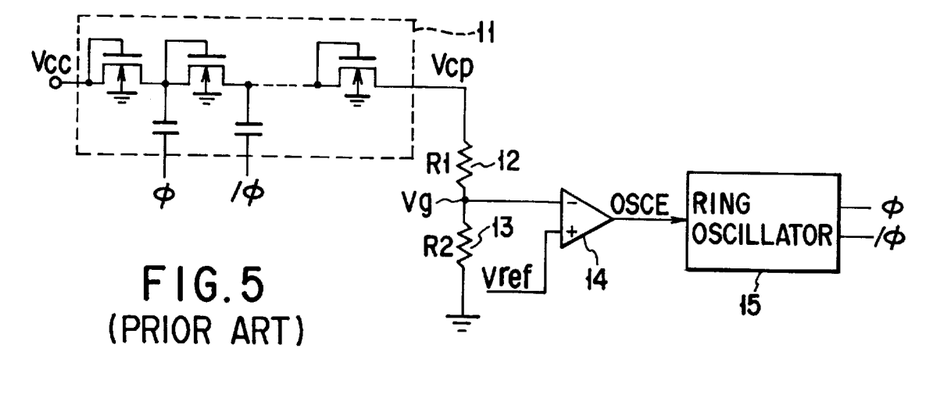
FIG. 5 is a diagram showing an example of a conventional circuit in which a booster circuit is added with a boost level detector circuit.

FIG. 5 shows a circuit in which a conventional booster circuit is added with a circuit for detecting an output voltage of the booster circuit to control the booster circuit.

In FIG. 5, the booster circuit 11 is the same as that shown in FIG. 1, and also, a power supply voltage Vcc and clock pulse signals φ and /φ are supplied while a boosted voltage Vcp is outputted. The output voltage Vcp is used, for example, as an internal power supply voltage of a semiconductor integrated circuit.

The boosted voltage Vcp is supplied to an end of a resistor 12, and the other end of the resistor 12 is connected to an end of a resistor 13. The other end of the resistor 13 is grounded. The resistance values of the resistors 12 and 13 are respectively expressed as R1 and R2.

An inverted input terminal of an operational amplifier 14 is connected to a connection point between the resistors 12 and 13. The voltage at the connection point is expressed as Vg. The inverted input terminal of the operational amplifier 14 is supplied with a reference voltage Vref. The operational amplifier 14 outputs an oscillator enable signal OSCE.

A ring oscillator 15 generates and outputs clock pulse signals φ and /φ in response to a signal OSCE.

In the circuit shown in FIG. 1, for example, the gate of the n-channel MOS transistor 1 and a first terminal of the current path is applied with a power supply voltage Vcc. The voltage at a second terminal of the current path of the transistor 1 is boosted to be higher than the power supply voltage Vcc. In this case, since the transistor 1 is turned off, no current must flow back to the first terminal from the second terminal of the current path.

However, if the MOS transistor 1 is of an intrinsic type, the threshold value Vt, for example, about −0.1V which is lower than that obtained in case of using an ordinary n-channel MOS transistor. Therefore, while a voltage Vcc is applied to the gate of the transistor 1, a slight current flows through the transistor 1, thus causing a back flow of a current in a direction from a boosted voltage to a power supply voltage. Further, if the back gate voltage of the transistor 1 is small or the power supply voltage Vcc is low, the back flow is more apparent.

Also, if the transistor operates in an environment of a high temperature, the threshold voltage Vt decreases to satisfy a relation of Vt<0. Therefore, a back flow as described above is caused too.

Also, if the transistor is of an enhancement type, the threshold value decreases due to downsizing of the transistor if the transistor, and a back flow is caused too.

Thus, if a transistor having a low threshold value Vt is used, a leakage current from the output side to the input power voltage Vcc side is always caused due to its back gate effect or a temperature influence, so that the operating current is increased.

Figure 6:
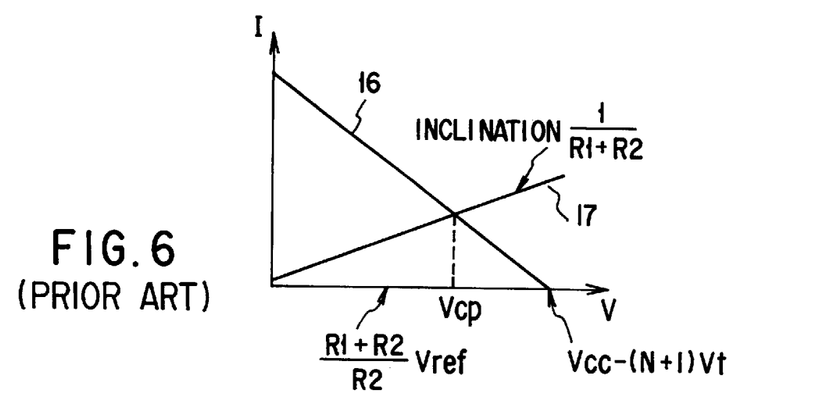
FIG. 6 is a graph showing load characteristics of the circuit shown in FIG. 5.

Consideration is then taken into a case in which the power supply voltage Vcc is higher than the output voltage Vcp of the booster circuit in the circuit shown in FIG. 5. In FIG. 6, a line 16 represents a load characteristic of the booster circuit in the case, i.e., a relationship between the output voltage and the output current of the booster circuit 11. Another line 17 represents a relationship between a voltage applied between both ends of the resistors 12 and 13 connected in series, and a current flowing through the resistors 12 and 13. The voltage at the cross point of the lines 16 and 17 is the output voltage Vcp of the booster circuit 11. The number of capacitors in the booster circuit 11 is expressed as N, and the threshold value of the MOS transistors constituting the booster circuit 11 is expressed as Vt. A desired power supply voltage is [(R1+R2)/R2]×Vref.

Where a relation of Vcc−(N+1)×Vt>[(R1+R2)/R2]×Vref is satisfied, the booster circuit 11 does not perform boosting but outputs a voltage obtained by reducing the power supply voltage Vcc, as an internal power supply voltage.

From a relation of $[R2/(R1+R2)] \times [Vcc-(N+1) \times Vt](=Vg) > Vref$, the output signal OSCE of the operational amplifier 14 is of a low level. Therefore, the ring oscillator 15 does not operate, and each of the signals $\phi$ and $/\phi$ is kept at a low or high level.

Consequently, the output voltage Vcp is higher than the desired level $[(R1+R2)/R2] \times Vref$. The difference between the output voltage and the desired voltage level increases as an external power supply voltage Vcc increases, as can be seen from FIG. 6.

If the external power supply voltage Vcc is allowed to exceed a standard voltage of 3V and increase to, for example, 5V, the internal power supply voltage increases in accordance with the external power supply voltage Vcc. Then, a problem occurs in the reliability of peripheral elements and memory cells. Like in the booster circuit shown in FIG. 1, a problem occurs in that a current flows back to the power supply voltage in the booster circuit in an operation environment of a high temperature. Further, if the threshold voltage decreases due to the same factors as those in the case of the booster circuit shown in FIG. 1, the internal power supply voltage Vcp increases, thereby affecting the reliability of peripheral elements and memory cells.

BRIEF SUMMARY OF THE INVENTION

Accordingly, it is an object of the present invention to provide a booster circuit in which a current does not flow back to an external power supply voltage and a constant voltage is outputted with a wide margin for an external power supply voltage, and a semiconductor memory device having the booster circuit.

According to an aspect of the present invention, there is provided a booster circuit comprising: a booster unit having a voltage input terminal, a voltage output terminal, and a signal input terminal; and an n-type MOS transistor having a current path having an end supplied with a power supply voltage and another end connected to the voltage input terminal of the booster unit, and having a gate supplied with an inverted signal of a signal supplied to the signal input terminal of the booster unit.

According to another aspect of the present invention, there is provided a booster circuit comprising: a plurality of booster units, each having a voltage input terminal, a voltage output terminal, and a signal input terminal, and connected in series to form a plurality of stages, respectively, such that the voltage input terminal of the booster unit at a present stage is connected to the voltage output terminal of the booster unit at a preceding stage and such that the signal input terminal of the booster unit at the present stage is connected to the signal input terminal of the preceding stage; and an n-type MOS transistor having a current path having an end supplied with a power supply voltage and another end connected to the voltage input terminal of the booster unit at a first stage, and having a gate supplied with an inverted signal of a signal supplied to the signal input terminal of the booster unit at the first stage.

In the booster circuit described above, the n-type MOS transistor is turned off when the booster unit at the first stage operates. Also, the booster circuit may comprise: a detector circuit for comparing a voltage value of the voltage output terminal of the booster unit at a last stage with a preset value, and for outputting an oscillator circuit activation signal in accordance with a comparison result; and an oscillator circuit for generating the signal to be supplied to each of the signal input terminals of the plurality of booster units, in accordance with the oscillator circuit activation signal. The n-type MOS transistor may be of an intrinsic type. Each of the booster units may include: an n-type MOS transistor having a current path and a gate, connected such that an end of the current path and the gate are connected to the voltage input terminal and such that another end of the current path is connected to the voltage output terminal; and a capacitor having an end connected to the voltage input terminal and another end connected to the signal input terminal. In this case, the n-type MOS transistors included in the booster units may be of an intrinsic type.

According to further another aspect of the present invention, there is provided booster circuit comprising: a booster unit having a voltage input terminal, a voltage output terminal, and a signal input terminal; and an n-type MOS transistor having a current path having an end supplied with a power supply voltage and another end connected to the voltage input terminal of the booster unit, and having a gate supplied with an AND signal of a booster circuit activation signal and an inverted signal of a signal supplied to the signal input terminal of the booster unit.

According to further another aspect of the present invention, there is provided a booster circuit comprising: a plurality of booster units each having a voltage input terminal, a voltage output terminal, and a signal input terminal, and connected in series to form a plurality of stages, respectively, such that the voltage input terminal of the booster unit at a present stage is connected to the voltage output terminal of the booster unit at a preceding stage and such that the signal input terminal of the booster unit at the present stage is connected to the signal input terminal of the preceding stage; and an n-type MOS transistor having a current path having an end supplied with a power supply voltage and another end connected to the voltage input terminal of the booster unit at a first stage, and having a gate supplied with an AND signal of a booster circuit activation signal and an inverted signal of a signal supplied to the signal input terminal of the booster unit at the first stage.

In the booster circuit described above, the n-type MOS transistor is turned off when the booster unit at the first stage operates. Also, the booster circuit may further comprise: a detector circuit for comparing a voltage value of the voltage output terminal of the booster unit at a last stage with a preset value, and for outputting an oscillator circuit activation signal in accordance with a comparison result and the booster circuit activation signal; and an oscillator circuit for generating the signal to be supplied to each of the signal input terminals of the plurality of booster units, in accordance with the oscillator circuit activation signal and the booster circuit activation signal. The n-type MOS transistor may be of an intrinsic type. Each of the booster units includes: an n-type MOS transistor having a current path and a gate, connected such that an end of the current path and the gate are connected to the voltage input terminal and such that another end of the current path is connected to the voltage output terminal; and a capacitor having an end connected to the voltage input terminal and another end connected to the signal input terminal. In this case, the n-type MOS transistors included in the booster units may be of an intrinsic type.

Further, according to another aspect of the present invention, there is provided a semiconductor memory device comprising: a booster circuit including a plurality of booster units each having a voltage input terminal, a voltage output terminal, and a signal input terminal, and connected in series to form a plurality of stages, respectively, such that the voltage input terminal of the booster unit at a present stage is connected to the voltage output terminal of the booster unit at a preceding stage and such that the signal input terminal of the booster unit at the present stage is supplied with an inverted signal of a signal supplied with the signal input terminal of the booster unit at the preceding stage, and an n-type MOS transistor having a current path having an end supplied with a power supply voltage and another end connected to the voltage input terminal of the booster unit at a first stage, and having a gate supplied with an inverted signal of a signal supplied to the signal input terminal of the booster unit at the first stage or supplied with an AND signal of the inverted signal and a booster circuit activation signal; a reference voltage generator circuit for generating a reference voltage; and an internal voltage generator circuit for generating a voltage to be supplied to a memory cell from a boosted voltage obtained through the voltage output terminal of the booster unit at a last stage, with reference to the reference voltage.

In the semiconductor memory device described above, the booster circuit may further comprise: a detector circuit for comparing a voltage value of the voltage output terminal of the booster unit at the last stage with a preset value, and for outputting an oscillator activation signal in accordance with a comparison result; and an oscillator circuit for generating the signal to be supplied to each of the signal input terminals of the plurality of booster units, in accordance with the oscillator circuit activation signal.

In the semiconductor memory device described above, the detector circuit may compare the voltage value of the voltage output terminal of the booster unit at the last stage with the preset value, and may output the oscillator circuit activation signal in accordance with the comparison result and the booster circuit activation signal. Further, the oscillator circuit may generate the signal to be supplied to each of the signal input terminals of the plurality of booster units, in accordance with the oscillator circuit activation signal and the booster circuit activation signal. Also, each of the booster units may include: an n-type MOS transistor having a current path and a gate, connected such that an end of the current path and the gate are connected to the voltage input terminal and such that another end of the current path is connected to the voltage output terminal; and a capacitor having an end connected to the voltage input terminal and another end connected to the signal input terminal. In this case, the n-type MOS transistors included in the booster units may be of an intrinsic type.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE INVENTION

Preferred embodiments of the present invention will now be described with reference to the accompanying drawings.

Figure 7:
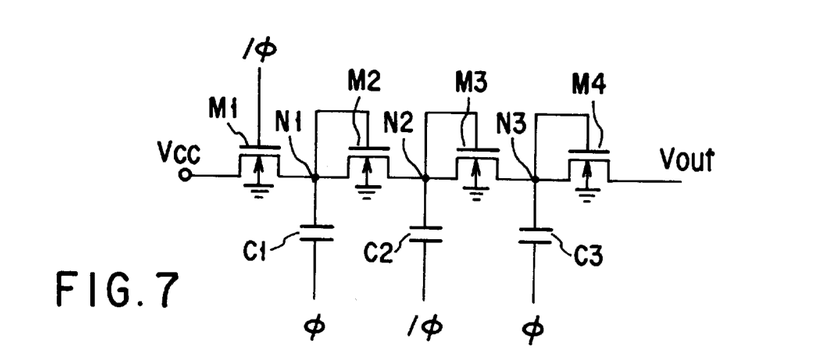
FIG. 7 is a diagram showing a structure of a booster circuit according to a first embodiment of the present invention.

FIG. 7 shows a structure of a booster circuit according to a first embodiment of the present invention. In the following description, same components are referred to by same references, and detailed explanation will be omitted herefrom.

In the circuit shown in FIG. 7, a clock pulse signal $\phi$ is supplied to an end of a capacitor C1 and an end of a capacitor C3, and an inverted signal /$\phi$ of the clock pulse signal $\phi$ is supplied to a gate of a n-channel MOS transistor M1 and an end of a capacitor C2. An end of a current path of the n-channel MOS transistor M1 is supplied with a power supply voltage Vcc, and the other end of the current path of the MOS transistor M1 is connected to an end of a current path of an n-channel MOS transistor M2 and a gate thereof, as well as an end of the capacitor C1. This connection is obtained at a connection point called a junction point N1. The other end of the current path of the MOS transistor M2 is connected to an end of a current path of an n-channel MOS transistor M3 and a gate thereof, as well as an end of a capacitor C2. This connection is obtained at a connection point called a junction point N2. The other end of the MOS transistor M3 is connected to an end of a current path of an n-channel MOS transistor M4 and a gate thereof, as well as an end of a capacitor C3. This connection is obtained at a connection point called a junction point N3. The other end of the current path of the MOS transistor M4 outputs an output voltage Vout.

The threshold value of each of the n-channel MOS transistors M1 to M4 is expressed as Vt.

Although the present embodiment adopts MOS transistors M1 to M4 arranged to form a plurality of stages, the structure is not limited hitherto but MOS transistors M3 and M4 may be removed.

In the following, operation of the circuit shown in FIG. 7 will be explained.

In this circuit, the gate of the transistor M1 whose end is supplied with the power supply voltage is supplied with a signal /φ having a phase opposite to that of the pulse signal φ supplied to the signal input terminal of the capacitor C1 for the boosting at the first stage. When the signal /φ is at a high level, the transistor M1 is conductive. In this state, the signal φ is at a low level, so that the transistor M2 is turned off. Therefore, the junction point N1 is charged to a voltage defined by Vcc–Vt.

Next, when the signal /φ goes to a low level and the signal φ goes to a high level, the transistor M1 is turned off and the transistor M2 is turned on. In this state, the voltage at the junction point N1 is Vcc–Vt+Vcc. The electric charges charged at the junction point N2 are not discharged since the transistor M1 is turned off and no discharge path to the power supply voltage Vcc exists. As a result, wasteful discharging to the external power supply voltage Vcc can be avoided.

Thus, according to the present embodiment, wasteful discharging from inside of the booster circuit to an external power supply voltage Vcc can be avoided, so that the operation efficiency as a charge pump can be improved.

In addition, in comparison with a conventional apparatus in which a power supply voltage is supplied to the gate of the transistor M1, a ground potential is supplied thereto according to the present embodiment, so that the cut-off current of the transistor M1 is greatly reduced. Therefore, it is not necessary to consider the cut-off characteristic of each transistor, and n-channel MOS transistors each having a short channel length can be used for the booster circuit. As a result of this, it is possible to reduce the parasitic resistance of transfer gates, to decrease the threshold value of each transistor, and to reduce the layout area of the circuit.

Figure 8:
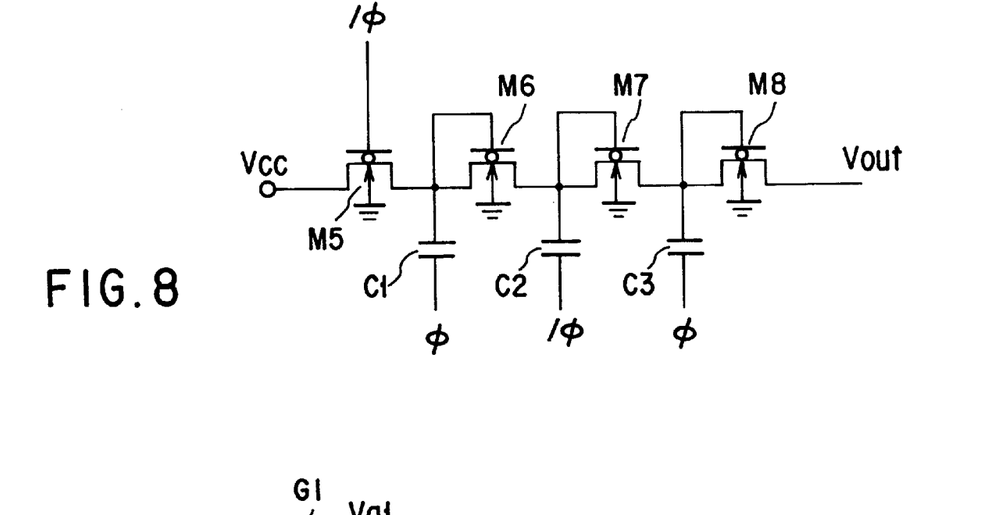
FIG. 8 is a diagram showing a structure of a booster circuit according to a second embodiment of the present invention.

FIG. 8 shows a structure of a booster circuit according to a second embodiment of the present invention.

In the circuit shown in FIG. 8, the transistors M1 to M4 in the circuit shown in FIG. 7 are replaced with intrinsic n-channel MOS transistors M5 to M8 each formed on a p-type substrate. The other components are the same as those of the circuit shown in FIG. 7.

Although the present embodiment uses MOS transistors M5 to M8 respectively arranged to form a plurality of stages, the structure is not limited hitherto but may be arranged such that MOS transistors M7 and M8 are removed.

Operation of the circuit shown in FIG. 8 is the same as that of the circuit shown in FIG. 7.

According to the present embodiment, the same advantages are obtained as those in the first embodiment. Further, an intrinsic n-channel MOS transistor has a threshold value of an enhancement type MOS transistor used in the first embodiment. Therefore, a voltage drop caused at each stage of the transfer gates is reduced, so that a high boosted voltage can be generated with less stages than in the first embodiment, resulting in an improvement of the efficiency of the booster circuit.

Figure 9:
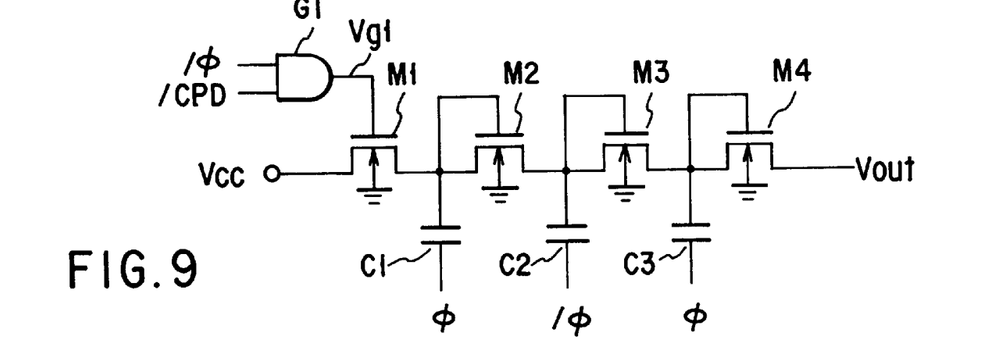
FIG. 9 is a diagram showing a structure of a booster circuit according to a third embodiment of the present invention.

FIG. 9 shows a structure of a booster circuit according to a third embodiment of the present invention.

The circuit shown in FIG. 9 is arranged such that the gate of the n-channel MOS transistor M1 shown in FIG. 7 is not supplied with a signal /φ, but is supplied with a logic product signal which is a logical product of the signal /φ and an inverted signal /CPD of a charge pump disable signal. Specifically, a first input terminal of an AND gate G1 is supplied with a. signal /φ, and a second input terminal of the AND gate G1 is supplied with an inverted signal /CPD of a charge pump disable signal. The output terminal of the AND gate G1 is connected to the gate of the transistor M1. The other components are the same as those shown in FIG. 7.

In the present embodiment, the signal /CPD is at a low level in a state in which the booster circuit is not operated, for example, in a stand-by state. Therefore, also in this state, the transistor M1 is turned off, so that a back flow to the power supply voltage Vcc can be prevented.

Figure 10:
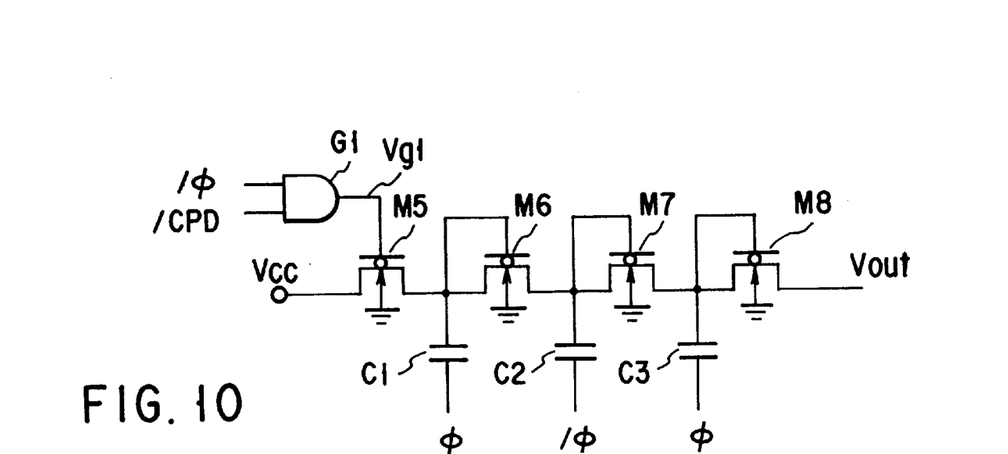
FIG. 10 is a diagram showing a structure of a booster circuit according to a fourth embodiment of the present invention.

FIG. 10 shows a structure of a booster circuit according to a fourth embodiment.

The circuit shown in FIG. 10 is arranged such that the gate of the n-channel MOS transistor M5 shown in FIG. 8 is not supplied with a signal /φ, but is supplied with a logic product signal which is a logical product of the signal /φ and an inverted signal /CPD of a charge pump disable signal. Specifically, a first input terminal of an AND gate G1 is supplied with a signal /φ, and a second input terminal of the AND gate G1 is supplied with an inverted signal /CPD of a charge pump disable signal. The output voltage of the AND gate G1 is expressed as Vg1. The other components are the same as those shown in FIG. 8.

In the present embodiment, the signal /CPD is at a low level in a state in which the booster circuit is not operated, for example, in a stand-by state. Therefore, also in this state, the transistor M1 is turned off, so that a back flow to the power supply voltage Vcc can be prevented.

Figure 11:
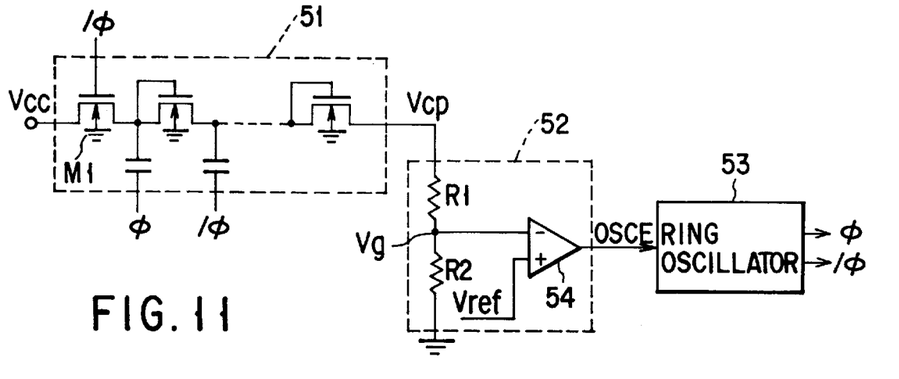
FIG. 11 is a diagram showing a structure of a booster circuit added with a boost level detector circuit and an oscillator circuit, according to a fifth embodiment of the present invention.

FIG. 11 shows a structure of a booster circuit added with a boost level detector circuit and an oscillator circuit, according to a fifth embodiment of the present invention.

In the circuit shown in FIG. 11, a booster circuit 51 is the same as the circuit shown in FIG. 7, for example, The output voltage Vcp of the booster circuit 51 is supplied to an input terminal of a boost level detector circuit 52.

Figure 12:
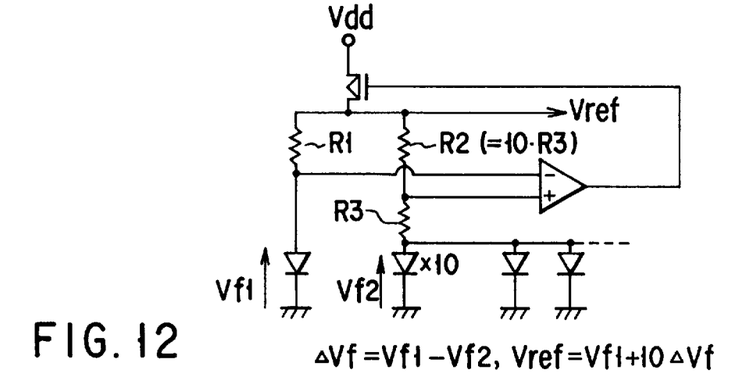
FIG. 12 is a diagram showing a general example of a structure of the band gap reference circuit.

In the boost level detector circuit 52, the output voltage Vcp of the booster circuit is supplied to an end of a resistor R1. The other end of the resistor R1 is connected to an end of a resistor R2 and an inverted input terminal of an operational amplifier 54. The voltage at the connection point therebetween is expressed as Vg. The other end of the resistor R2 is grounded. A non-inverted input terminal of the operational amplifier is supplied with a reference voltage Vref. The reference voltage Vref is supplied from a band gap reference circuit, for example. For references, a general example of a structure of the band gap reference circuit is shown in FIG. 12. The band gap reference circuit is constructed so as to generate a reference voltage Vref which has a low temperature dependency and a less power supply voltage dependency. The operational amplifier 54 outputs an oscillator enable signal OSCE.

The oscillator enable signal OSCE is supplied to an input terminal of the ring oscillator 53. The ring oscillator 53 generates clock pulse signals $\phi$ and $/\phi$ to be supplied to the booster circuit 51, in response to the signal OSCE. The clock pulse signals $\phi$ and $/\phi$ have the same waveforms as shown in FIG. 2.

In the following, operation of the present embodiment will be explained.

A voltage vg of the inverted input terminal of the operational amplifier 54 is obtained by $[R2/(R1+R2)]\cdot Vcp$. The boost level detector circuit 52 monitors the output voltage Vcp of the booster circuit 51. When the output voltage Vcp is lower than a predetermined level, i.e., when Vg<Vref is satisfied, the output signal OSCE of the boost level detector circuit 52 goes to a high level. The ring oscillator 53 is activated and generates pulse signals $\phi$ and $/\phi$. Therefore, the booster circuit 51 performs boosting operation.

When the output voltage Vcp goes to a level higher than a predetermined level, i.e., when Vg>Vref is satisfied, the output signal OSCE of the boost level detector circuit 52 goes to a low level. Therefore, the ring oscillator 53 is deactivated and does not generate pulse signals $\phi$ and $/\phi$. Accordingly, the booster circuit is deactivated and the transistor M1 in the booster circuit 51 is turned off.

Therefore, according to the present embodiment, a back flow of a current to the power supply voltage Vcc can be prevented.

Figure 13:
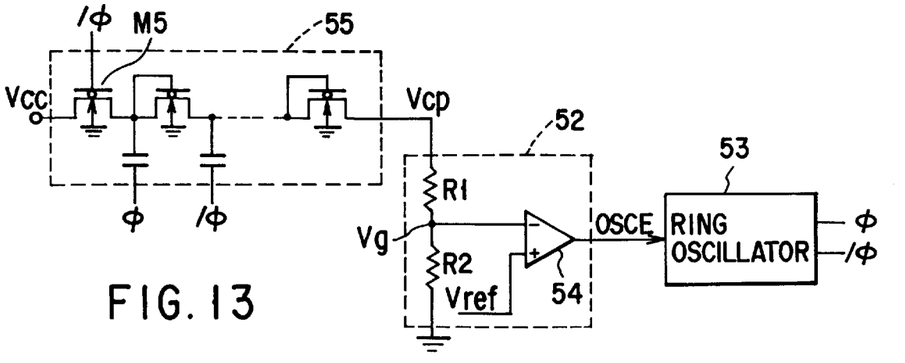
FIG. 13 is a diagram showing a structure of a booster circuit added with a boost level detector circuit and an oscillator circuit, according to a sixth embodiment of the present invention.

FIG. 13 shows a structure of a booster circuit added with a boost level detector circuit and an oscillator circuit, according to a sixth embodiment of the present invention.

The circuit shown in FIG. 13 is arranged such that the booster circuit 51 shown in FIG. 11 is replaced with a booster circuit 55 shown in FIG. 8. The other components are the same as those of the circuit shown in FIG. 11.

Operation of the circuit shown in FIG. 13 is the same as that of the circuit shown in FIG. 11.

The present embodiment achieves the same advantages as those of the second and fifth embodiments. Specifically, a back flow of a current from inside the booster circuit to the power supply voltage Vcc can be prevented. Further, since transistors of the booster circuit 55 are constituted by intrinsic n-channel MOS transistors, it is possible to improve the efficiency of the booster circuit.

Figure 14:
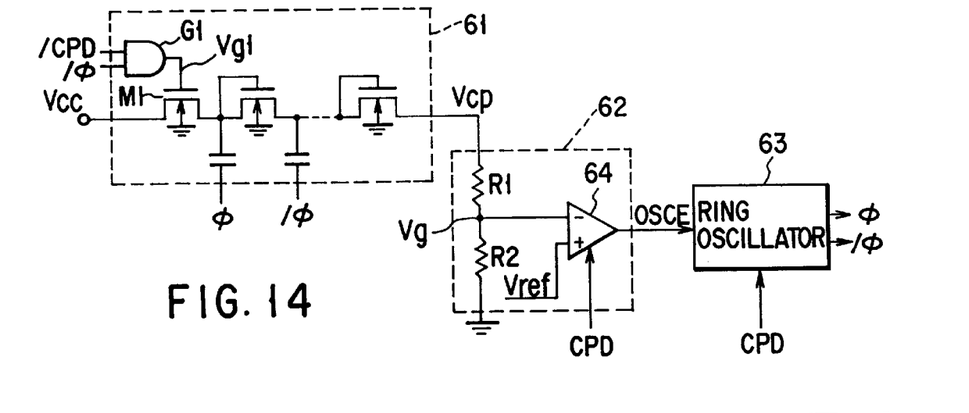
FIG. 14 is a diagram showing a structure of a booster circuit added with a boost level detector circuit and an oscillator circuit, according to a seventh embodiment of the present invention.

FIG. 14 shows a structure of a booster circuit added with a boost level detector circuit and an oscillator circuit, according to a seventh embodiment of the present invention.

In the circuit shown in FIG. 14, a booster circuit 61 is the same as the circuit shown in FIG. 9. The output voltage Vcp of the booster circuit 61 is supplied to an input terminal of a boost level detector circuit 62.

In the boost level detector circuit 62, the output voltage Vcp of the booster circuit is supplied to an end of a resistor R1. The other end of the resistor R1 is connected to an end of a resistor R2 and an inverted input terminal of an operational amplifier 64. The voltage at the connection point therebetween is expressed as Vg. The other end of the resistor R2 is grounded. A non-inverted input terminal of the operational amplifier 64 is supplied with a reference voltage Vref. The reference voltage Vref is supplied from a band gap reference circuit, for example. The operational amplifier 64 is supplied with a charge pump disable signal CPD. The operational amplifier 64 outputs an oscillator enable signal OSCE.

The oscillator enable signal OSCE is supplied to an input terminal of a ring oscillator 63. The ring oscillator 63 is supplied with the charge pump disable signal CPD. The ring oscillator 63 generates clock pulse signals $\phi$ and $/\phi$.

Figure 15:
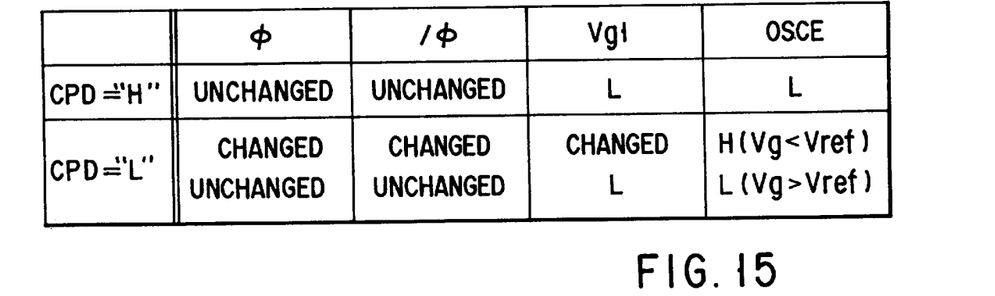
FIG. 15 is a table showing statuses of signals in the embodiment shown in FIG. 14.

FIG. 15 shows statuses of signals CPD, $\phi$, $/\phi$, Vg1, and OSCE.

When the signal CPD is at a high level, the operational amplifier 64 stops operating and the signal OSCE goes to a low level. Further, the ring oscillator 62 stops operating since the signal CPD and the signal OSCE are at a low level, so that each of the signals $\phi$ and $/\phi$ is kept at a low or high level. In addition, since the signal CPD is at a low level, the output signal vg1 of an AND gate G1 goes to a low level. Accordingly, the transistor M1 in the booster circuit 61 is turned off, and therefore, it is possible to prevent a back flow of a current to the power supply voltage Vcc.

When the signal CPD is at a low level, the circuit shown in FIG. 14 operates in the same manner as in the fifth embodiment (in FIG. 11) described above.

The present embodiment achieves the same advantages as those of the third and fifth embodiments described above. Specifically, a back flow of a current from inside the booster circuit to the power supply voltage Vcc can be prevented. Further, in the present embodiment, when the external power supply voltage Vcc goes to a level higher than a boost level, i.e., when $Vcc-(N+1)Vt>[(R1+R2)/R2]\times Vref$ is satisfied, Vg>Vref is satisfied, so that the signal CPE goes to a high level. In this case, the transistor M1 in the booster circuit is turned off, with the result that the booster circuit is deactivated. Therefore, the output voltage Vcp is not excessively charged to $Vcc-(N+1)Vt$, unlike in a conventional apparatus. Thus, even when the external power supply voltage Vcc fluctuates, the internal power supply voltage does not fluctuate, so that the booster circuit can be operated stably with respect to an external power supply voltage Vcc which is as high as $[(R1+R2)/R2]\times Vref+(N+1)Vt$ or more higher.

Thus, according to the present embodiment, even when the power supply voltage Vcc becomes high, the internal elements are supplied with a constant voltage, so that the reliability of the elements is improved.

Figure 16:
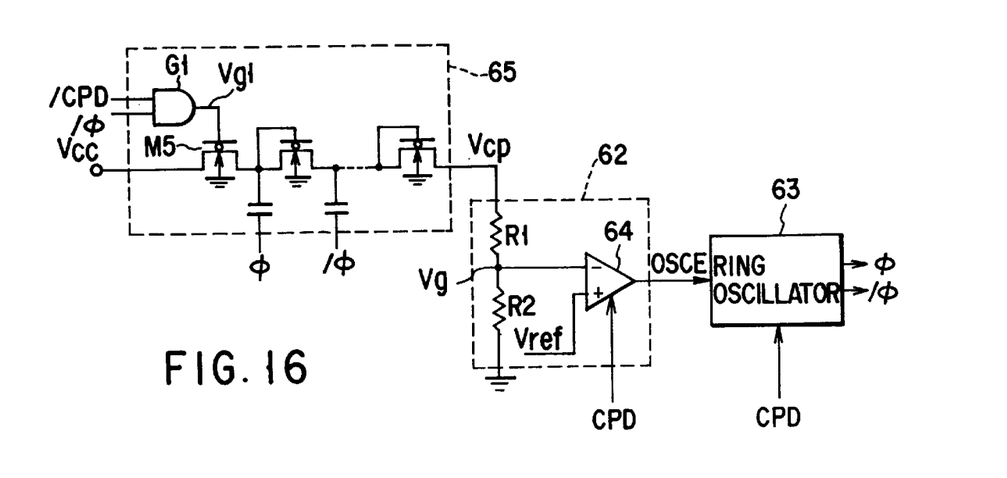
FIG. 16 is a diagram showing a structure of a booster circuit added with a boost level detector circuit and an oscillator circuit, according to an eighth embodiment of the present invention.

FIG. 16 shows a structure of a booster circuit added with a boost level detector circuit and an oscillator circuit, according to an eighth embodiment of the present invention.

The circuit shown in FIG. 16 is arranged such that the booster circuit 61 shown in FIG. 14 is replaced with the booster circuit 65 shown in FIG. 10. The other components are the same as those shown in FIG. 14.

Also, the circuit shown in FIG. 16 operates in the same manner as in the seventh embodiment (in FIG. 14) described above.

The present embodiment achieves the same advantages as those of the fourth and fifth embodiments described above. Specifically, in a state in which the booster circuit is not operated, the transistor M1 in the booster circuit is turned off, so that a back flow to the power supply voltage Vcc can be prevented, and fluctuations of the internal power supply voltage can be prevented against fluctuations of the external power supply voltage, with the result that the reliability of the elements can be improved. Further, in a state in which the booster circuit is operated, a back flow of a current from inside the booster circuit to the power supply voltage Vcc can be prevented. In addition, since the transistors in the booster circuit are of intrinsic n-channel MOS transistors, the boost efficiency can be improved.

Figure 17:
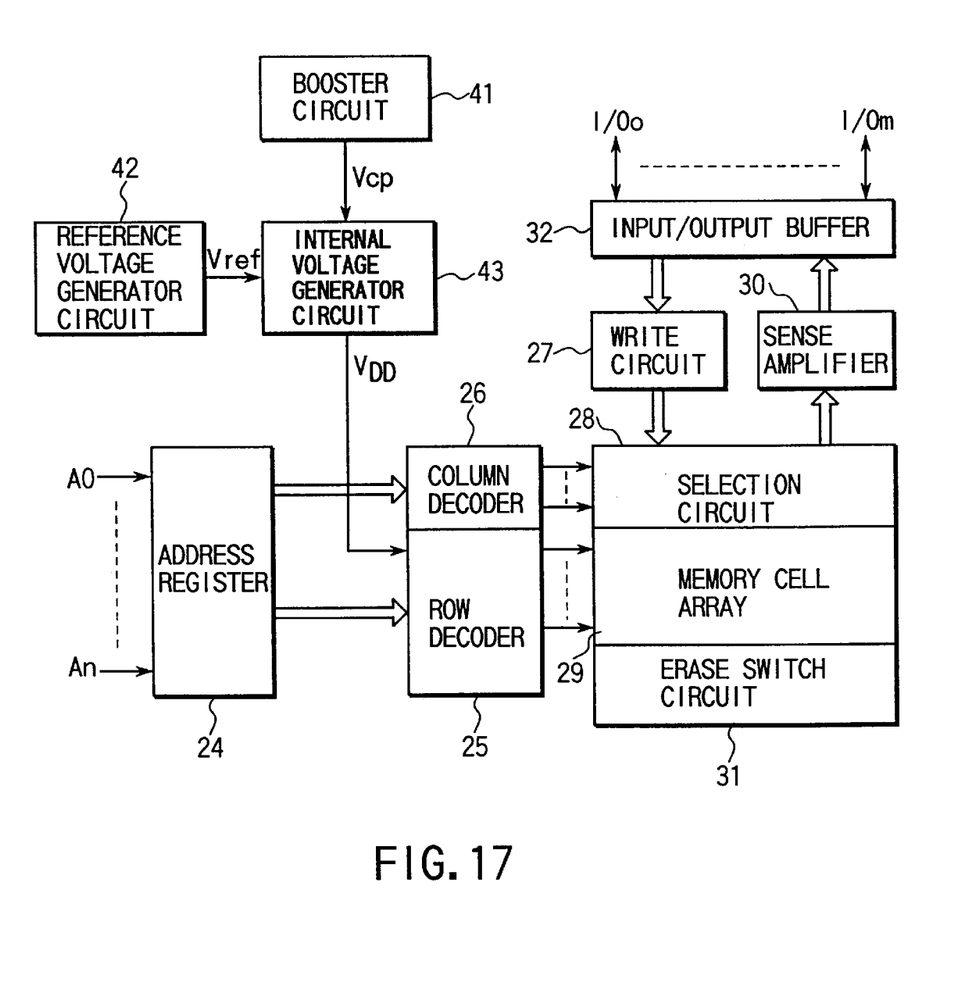
FIG. 17 is a block diagram showing the entire structure of a non-volatile semiconductor memory using a booster circuit according to the present invention.

FIG. 17 shows the entire structure of a non-volatile semiconductor memory using a booster circuit according to the present invention.

The booster circuit 41 generates a boosted voltage Vcp.

A reference voltage generator circuit 42 generates a reference voltage Vref. An internal voltage generator circuit 43 generates an internal voltage $V_{DD}$ so as to correspond to a program mode, a verify mode, or the like, from the boosted voltage Vcp, with reference to the reference voltage Vref.

Internal address signals (or external address signals) A0 to An are supplied to a row decoder 25 and a column decoder 26 through an address register 24. In addition, an output voltage $V_{DD}$ of the internal voltage generator circuit 43 is applied through the row decoder 25 to a specified word line selected by the address signals A0 to An.

In a program mode, data is supplied to a specified memory cell in the memory cell array 29, through an input/output buffer 32, a write circuit 27, and a selection circuit 28.

In a read mode, data is used for verification, through the selection circuit 28 and a sense amplifier 30, or is outputted to outside the chip, further through the input/output buffer 32.

In an erase mode, the voltage to be applied to a source of a memory cell is switched by an erase switch circuit 31.

In the present embodiment, advantages equivalent to those of the embodiments described above can be obtained by using a booster circuit 41 according to the present invention. Specifically, a current is prevented from flowing back to the power supply voltage Vcc, in the booster circuit 41. Also, fluctuations of the internal power supply voltage are restricted against fluctuations of the external power supply voltage Vcc, so that the reliability of elements can be improved.

The booster circuit is naturally applicable not only to a non-volatile semiconductor memory device but also to other semiconductor memory devices.

As has been described above, according to the present invention, in the booster circuit, the transistor whose end is supplied with a power supply voltage is turned on/off by an inverted signal of a signal for booting a booster unit at a first stage or by an AND signal of the inverted signal and a booster circuit activation signal. Therefore, a back flow of a current from inside the booster circuit to the power supply can be prevented, thereby improving the efficiency of the booster circuit. Further, the fluctuations of the output voltage are not brought about even when the power supply voltage greatly fluctuates, so that the reliability of peripheral elements and memory cells can be improved and the allowable range of an external power supply voltage can be enhanced.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:
   a booster circuit having an input terminal, an output terminal, an n-number of transistors composed of a first, a second, . . . , an n-th (where n is a positive integer) transistors diode-connected, and an n-number of capacitors composed of a first, a second, . . . , a n-th capacitors, said n-number of transistors being serially connected between said input terminal and said output terminal, said first transistor being connected to said input terminal and said n-th transistor being connected to said output terminal, each of said n-number of capacitors having a first and a second electrodes, said first electrodes of said n-number of capacitors being respectively connected to gate electrodes of said n-number of transistors, the second electrodes of odd-numbered capacitors among said n-number of capacitors being supplied with a control signal, the second electrodes of even-numbered capacitors among said n-number of capacitors being supplied with a complementary signal of said control signal;

a terminal to which a power supply voltage is supplied;

a charge transfer transistor having a current path and a gate terminal, an end of said current path being connected to said input terminal of said booster circuit, another end of said current path being connected to said terminal, said gate terminal being supplied with said complementary signal of said control signal;

a differential amplifier circuit having a first and a second input terminals and an output terminal, said first input terminal being supplied with a voltage according to a potential of said output terminal of said booster circuit, said second input terminal being supplied with a reference voltage, said output terminal of said differential amplifier circuit outputting an output signal; and a circuit which is connected to said output terminal of said differential amplifier circuit and produces the control signal and the complimentary signal thereof to be supplied to said booster circuit and said charge transfer transistor.

2. The semiconductor device according to claim 1, wherein said charge transfer transistor is turned off when said first transistor of said first booster circuit operates.

3. The semiconductor device according to claim 1, wherein each of said n-number of transistors is a MOS transistor.

4. The semiconductor device according to claim 1, wherein each of said n-number of transistors is an n-type MOS transistor.

5. The semiconductor device according to claim 1, wherein each of said n-number of transistors is an intrinsic type MOS transistor.

6. The semiconductor device according to claim 1, wherein said charge transfer transistor is a MOS transistor.

7. The semiconductor device according to claim 1, wherein said charge transfer transistor is an n-type MOS transistor.

8. The semiconductor device according to claim 1, wherein said charge transfer transistor is an intrinsic type MOS transistor.

9. A semiconductor device comprising:
   a booster circuit having an input terminal, an output terminal, an n-number of transistors composed of a first, a second, . . . , a n-th (where n is a positive integer) transistors diode-connected, and an n-number of capacitors composed of a first, a second, . . . , an n-th capacitors, said n-number of transistors being serially connected between said input terminal and said output terminal, said first transistor being connected to said input terminal and said n-th transistor being connected to said output terminal, each of said n-number of capacitors having a first and a second electrodes, said first electrodes of said n-number of capacitors being respectively connected to gate electrodes of said n-number of transistors, the second electrodes of odd-numbered capacitors among said n-number of capacitors being supplied with a control signal, the second electrodes of even-numbered capacitors among said n-number of capacitors being supplied with a complementary signal of said control signal;

a terminal to which a power supply voltage is supplied;

a charge transfer transistor having a current path and a gate terminal, an end of said current path being connected to said input terminal of said booster circuit, another end of said current path being connected to said terminal, said gate terminal being supplied with a signal based on said complementary signal of said control signal;

a differential amplifier circuit having a first and a second input terminals and an output terminal, said first input terminal being supplied with a voltage according to a potential of said output terminal of said booster circuit, said second input terminal being supplied with a reference voltage, said output terminal of said differential amplifier circuit outputting an output signal; and a circuit which is connected to said output terminal of said differential amplifier circuit and produces the control signal and the complimentary signal thereof to be supplied to said booster circuit and said charge transfer transistor.

10. The semiconductor device according to claim 9, wherein said signal based on said complementary signal of said control signal is an AND signal of a booster circuit activation signal and said complementary signal.

11. The semiconductor device according to claim 9, wherein said charge transfer transistor is turned off when said first transistor of said first booster circuit operates.

12. The semiconductor device according to claim 9, wherein each of said n-number of transistors is a MOS transistor.

13. The semiconductor device according to claim 9, wherein each of said n-number of transistors is an n-type MOS transistor.

14. The semiconductor device according to claim 9, wherein each of said n-number of transistors is an intrinsic type MOS transistor.

15. The semiconductor device according to claim 9, wherein said charge transfer transistor is a MOS transistor.

16. The semiconductor device according to claim 9, wherein said charge transfer transistor is an n-type MOS transistor.

17. The semiconductor device according to claim 9, wherein said charge transfer transistor is an intrinsic type MOS transistor.

* * * * *